United States Patent [19]

Lindblom et al.

[11] Patent Number: 5,038,132
[45] Date of Patent: Aug. 6, 1991

[54] DUAL FUNCTION CIRCUIT BOARD, A RESISTOR ELEMENT THEREFOR, AND A CIRCUIT EMBODYING THE ELEMENT

[75] Inventors: Scott H. Lindblom, S. Dartmouth, Mass.; Wray E. Johnson, Cromwell, Conn.

[73] Assignee: Texas Instruments Incorporated, Dallas, Tex.

[21] Appl. No.: 455,468

[22] Filed: Dec. 22, 1989

[51] Int. Cl.⁵ .......................................... H01C 1/012
[52] U.S. Cl. ................................. 338/307; 338/314; 361/401
[58] Field of Search ............... 338/307, 306, 308, 309, 338/314; 361/402, 401, 388, 387, 397, 411, 386, 389, 414; 428/209, 901; 174/250, 255, 256, 257, 258; 165/185

[56] References Cited

U.S. PATENT DOCUMENTS

| | | | |
|---|---|---|---|
| 3,353,134 | 11/1967 | Elarde | 338/308 X |
| 3,649,945 | 3/1972 | Waits | 338/309 |
| 3,876,912 | 4/1975 | Sanders | 338/309 X |
| 4,220,945 | 9/1980 | Kakuhashi et al. | 338/308 |
| 4,810,563 | 3/1989 | DeGree et al. | 428/209 |

OTHER PUBLICATIONS

Planar Resistor Technology, Ohmega Technologies Issued 1985.

Primary Examiner—Marvin M. Lateef
Attorney, Agent, or Firm—James P. McAndrews; John A. Haug; Melvin Sharp

[57] ABSTRACT

A dual function circuit board substrate has a layer or sheet of ultrathin metal of relatively high electrical resistivity having a selected sheet resistivity characteristic bonded to a thin layer or sheet of metal of relatively high electrical conductivity. The layer of high electrical resistivity material is adhered to one side of a layer of organic electrically insulating material, and a heat-sink metal layer is adhered to an opposite side of the organic insulating layer to withdraw heat from the layer of high electrical resistivity material. The thin layers of high electrical resisivity and conductivity materials are selectively etched from the organic layer material to form a select circuit, and the layer of high electrical conductivity material is selectively etched from portions of the circuit to form one or more resistor elements having selected electrical resistances in the circuit. A multiplicity of particles of material of relatively higher thermal conductivity than the organic material is dispersed in the organic material to enhance heat withdrawal from the circuit, particularly at the locations of the resistor element, to permit the resistor elements to be compactly proportioned to provide said electrical resistance while maintaining operating temperature of the resistance elements in the circuit within a selected temperature range.

4 Claims, 2 Drawing Sheets

DUAL FUNCTION CIRCUIT BOARD, A RESISTOR ELEMENT THEREFOR, AND A CIRCUIT EMBODYING THE ELEMENT

BACKGROUND OF THE INVENTION

The field of the invention is that of dual function circuit board substrates and the invention relates more particularly to improved dual function circuit board substrates and to circuits and circuit elements formed therewith.

A known dual function circuit board substrate has an ultrathin film, sheet or layer of a metal such as a nickel-chromium alloy or the like of relatively high electrically resistivity deposited on one side of a thin copper material or the like by sputtering or the like. A thin sheet or layer of an organic electrially insulating material is bonded to the other side of the sheet of high resistivity metal in any conventional way, and a heat-sink metal layer is adhered to the opposite side of the organic insulating layer material, preferably by using the organic layer material as a heat-bonding adhesive or the like, for withdrawing heat from the sheet of metal of high electrical resistivity. The thin sheets of metal of high electrical conductivity and resistivity are selectively etched or otherwise removed from the organic layer material to form circuit paths in a selected electrical circuit, and the metal of relatively high electrical conductivity is etched or otherwise removed from selected portions of that circuit to form one or more resistor elements in the circuit. By using such a dual function substrate, resistor elements of substantial resistance are adapted to be very compactly accommodated in a circuit with high circuit density by a circuit designer with each resistor element being securely and reliably connected in the circuit in a very convenient manner by bonding of the relatively high electrical conductivity metal to the high resistivity metal at each end of the resistor element.

In that arrangement, the thickness of the high resistivity metal is not variable in the circuit design by the user of the dual function substrate. However the high resistivity layer of the substrate is said to have selected sheet resistivity characteristics whose units are ohms per square, a square being a portion of the thin high resistivity material in which the width and length of the resistor element are equal. With that relationship, a resistor element formed in the circuit with a wide resistor portion and a long length can have the same effective resistance as a resistor element of smaller width if the smaller resistor is also of appropriately shorter length. Accordingly, it is usually desirable to form resistor elements which are proportioned to provide desired electrical resistance levels using the smallest possible area of the circuit to achieve compact circuit design. Frequently however it is found that heat build-up in the circuit is a limiting factor in achieving a desired circuit density, particularly heat build-up in the area of such resistor elements, so that some of the density improvement capabilities of the dual function type of substrate in incorporating resistor elements in a circuit is not fully utilized.

BRIEF SUMMARY OF THE INVENTION

It is an object of this invention to provide a novel and improved dual function circuit board substrate; to provide an improved circuit having improved resistor elements therein; and to provide such an improved substrate, resistor element and circuit of rugged and reliable structure adapted to be used at low cost.

Briefly described, the novel and improved dual function circuit board substrate of the invention comprises a layer or sheet of ultrathin metal such as a nickle-chromium alloy or the like of relatively high electrical resistivity having a selected sheet resistivity characteristic. The sheet of high resistivity metal is bonded on one side to a layer or sheet of metal such as copper of relatively high electrical conductivity and is adhered on its opposite side to one side of a layer of organic electrically insulating material. A heat-sink layer of metal of relatively high thermal conductivity material such as copper or aluminum or the like is adhered to an opposite side of the organic insulating layer in any conventional manner, preferably by using the organic material itself as a heat-bonding adhesive. The thickness of electrically insulating layer is selectively limited to provide a predetermined level of electrical insulation between the heat-sink metal layer and the high electrical resistivity layer without excessively retarding heat-transfer from the high resistivity metal layer to the heat-sink layer and, in accordance with this invention, a multiplicity of particles of material such as ceramic or metal or the like of relatively higher thermal conductivity than the organic material of the insulating layer are dispersed in the organic material for enhancing heat-withdrawal from the high electrical resistivity material into the heat-sink layer of the substrate. The thin metal layers of relatively high electrical conductivity and high electrical resistivity are selectively removed from the organic material layer by etching or the like for forming circuit paths of a selected electrical circuit, and the metal layer of relatively high electrical conductivity is selectively etched from selected portions of the high electrical resistivity metal material in the circuit to form a resistor element or elements of selected electrical resistance in the circuit. In that arrangement, the resistors elements are proportioned to achieve improved circuit density and improved resistor density in the circuit while maintaining the operating temperature of the circuit, and particularly the temperature of the resistor element or elements within the circuit, within a selected temperature range. That is, by providing improved withdrawal of heat from resistor elements of selected electrical resistance embodying ultrathin layers of high resistivity material proportioned by reference to their sheet resistivity characteristics, the resistor elements are adapted to be proportioned with improved size characteristics for achieving increased circuit density while maintaining circuit and resistor operating temperatures within appropriate levels for safe and effective circuit operation.

BRIEF DESCRIPTION OF THE DRAWINGS

Other objects, advantages and details of the circuit board, resistor element and circuit of this invention appear in the following detailed description of preferred embodiments of the invention, the detailed description referring to the drawings in which.

DESCRIPTION OF THE PREFERRED EMBODIMENTS

Figure 1:
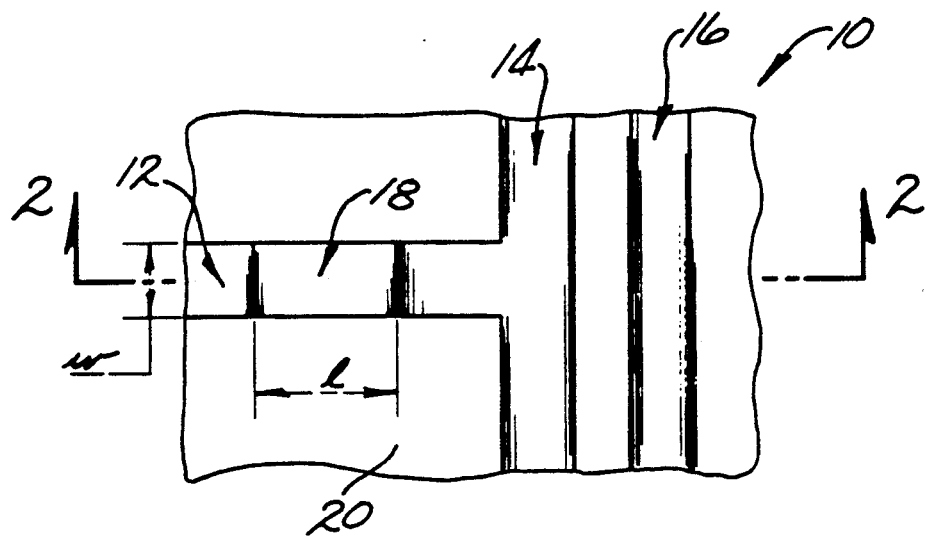
FIG. 1 is a partial plan view of a circuit according to this invention.
Figure 2:
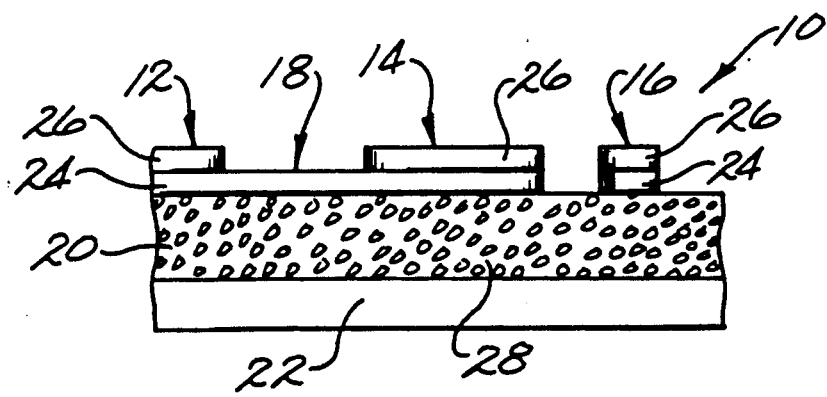
FIG. 2 is a section view along line 2—2 of FIG. 1.

Referring to the drawings, 10 in FIGS. 1 and 2 indicates a novel and improved circuit of the invention which is shown to include a plurality of circuit paths of any desired pattern or configuration as schematically represented at 12, 14 and 16 in FIG. 1 and to include at least one resistor element 18 having a selected electrical resistance in that circuit. The circuit includes a substrate 10 having a layer 20 of electrical insulating material supporting circuit paths and the resistor element on one side thereof and preferably having a heat-sink layer 22 supported in electrically insulated relation to the circuit paths and resistor element on an opposite side of the electrically insulating layer.

Preferably the circuit 10 comprises a dual function circuit board substrate having an ultrathin sheet, layer, film or foil 24 of a metal of relatively high electrical resistivity deposited on one side of a high electrical conductivity layer 26 and the high resistivity layer 24 is bonded to one side 20.1 of the insulating layer. Preferably for example, the resistivity layer 24 comprises a nickel-chromium or nickel-chromium-iron alloy or the like having nominal compositions of 80 to 85% nickel and 15-20% chromium or 65% nickel, 15% chromium, and 20% low carbon iron or the like having a relatively high electrical resistivity which is deposited on the high electrical conducting layer 24 to a thickness in the range from about 4 to 16 microinches or the like by a conventional sputtering process or in other conventional manner so that the high conductivity layer adheres to the high resistivity layer.

Preferably the organic electrically insulating layer 20 is formed of any conventional organic material used in forming electrically insulating circuit board substrates such as epoxies, acetal resins, polyimides, polyamides, polyimide-amides, polyesters, polyolefins, tetrafluoroethylene, and acrylonitrile butadiene styrene copolymers or the like.

Preferably the high electrical conductivity layer 26 comprises a thin sheet, layer or foil 26 of a metal such as copper, aluminum, silver, or a composite metal laminate of copper and aluminum or copper and invar or the like which is of relatively high electrical conductivity and which is bonded to the high resistivity layer 24. Preferably the sputtering of the high resistivity material into the high conductivity layer is regulated so that sputtering the high electrical conductivity layer 26 is securely bonded in electrically conductive relation to the high resistivity layer 24 the high conductivity preferably has a thickness on the order of about 0.0014 inches (1 oz copper). Of course other conventional thicknesses of circuit forming materials are also adapted to be used.

Preferably the heat-sink metal layer 22 is formed of a metal of relatively high thermal conductivity material such as copper or aluminum, copper-clad aluminum, or copper-clad Invar (36% nickel, blance iron) or the like and is secured at a side of the organic electrically insulating layer 20 opposite from the thin high electrical and resistivity layers 26, 24 for withdrawing heat from the high resistivity layer. Typically the heat sink layer has a thickness on the order of 0.002 to 0.125 inches. In accordance with this invention, a multiplicity of particles of material having a relatively higher thermal conductivity than the organic material of the electrically insulating layer is dispersed in the layer as indicated at 28 in FIG. 2 for enhancing heat-withdrawal from the high resistivity layer 24. Preferably for example, where the thickness of the electrically insulating layer 20 is on the order of 0.001 to 0.016 inches or the like, the particles have a particle size in the range from about 2 to 100 microns, and the particles comprise from about 2 to about 75% by volume of the insulating layer material. Preferably for example, the particles comprise aluminum oxide, boron nitride, silcon carbide or other oxides, nitrides or carbides of aluminum, boron, beryllium, manganese, zinc, silicon or titanium or the like or any combination thereof.

In that arrangement, the high resistivity layer 24 of the dual function substrate preferably has a sheet resistivity characteristic in the range from about 25 to 1000 ohms per square depending on the thickness and material used in the high resistivity layer. Accordingly where the resistor element 18 is formed of a dual function substrate to have a 25 ohm/square sheet resistivity and has a length l twice to its width w as shown in FIG. 1, the resistor element displays 50 ohms resistance in the selected circuit.

Figure 3:
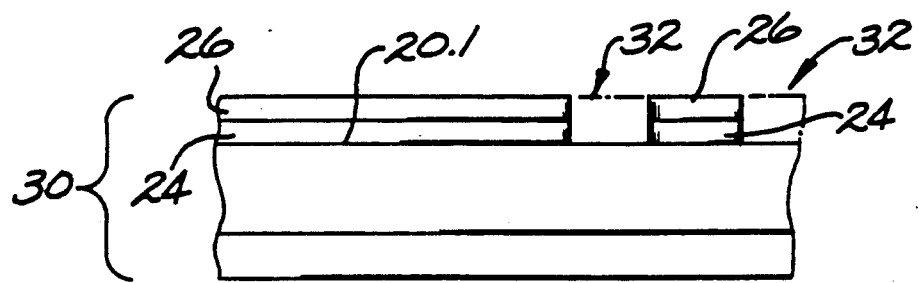
FIGS. 3 and 4 are section views similar to FIG. 2 illustrating steps in forming circuit and resistor element of FIGS. 1 and 2.
Figure 4:
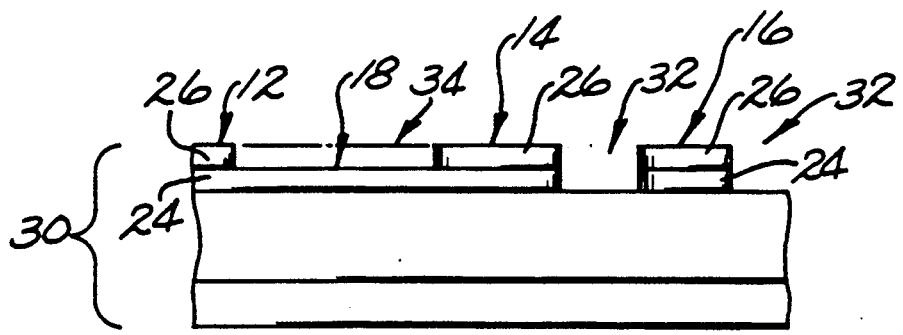

The circuit 10 illustrated in FIG. 1 is also adapted to be easily and economically formed in convenient manner as illustrated in FIGS. 3 and 4. That is, the dual function substrate 30 shown in FIGS. 3 and 4 is first subjected to chemical etching or the like using photoresists or the like in conventional manner for selectively removing portions of the high electrical resistivity and conductivity layers 24 and 26 as indicated at 32 in FIGS. 3 and 4 to form the the desired circuit path configuration or pattern as illustrated in FIG. 1. Then the thin high electrical conductivity material remaining in the circuit is subjected to chemical etching or the like using photoresists or the like for selectively removing portions of the high conductivity material as indicated at 34 in FIG. 4 for forming the resistor element 18 in the circuit 10. In that arrangement, the circuit path means 12, 14 remain electrically connected to the resistor element 18 at opposite ends of the resistor element in compact, reliable and effective manner so that the resistor element 18 is adapted to be provided with various small proportions for achieving the desired electrical resistance for the element 18 in the circuit 10. However the high conductivity portions 26 of the circuit paths 12, 14 and 16 otherwise provide high conductivity in the circuit 10. In addition, particles 28 dispersed in the organic insulating layer 20 are adapted to withdraw heat very rapidly from the resistor element so that the resistor element can be very small without risk of overheating the organic materials in the circuit substrate or the resistor or a semiconductor component or the like (not shown) which may be incorporated in the circuit 10 as will be understood. Preferably for example, particle fill in the organic insulating layer 20 is adapted to increase thermal conductivity in the layer 20 by 2 to 7 times the thermal conductivity of a corresponding thickness of organic material in the insulating layer for permitting very substantial reduction of the proportions of the resistor element while maintaining operating temperature of the resistor in the range from room or ambient temperature up to about 75° to 125° C. as may be desired for different resistor applications. It is noted that the heat-sink layer 24 is adapted to be omitted from the circuit 10 as originally formed, and the circuit 10 as formed without the heat-sink layer is adapted to be mounted in heat-transfer relation by heat-bonding of the organic layer material to a heat-sink means having heat dissipating fins or the like as may be desired.

It should be understood that although particular embodiments of the invention have been described by way of illustrating the invention, the invention includes all modifications and equivalents of the disclosed embodiments falling within the scope of the appended claims.

We claim:

1. A dual function circuit board substrate comprising a sheet of ultrathin metal of relatively high electrical resistivity having a selected sheet resistivity characteristic, a sheet of metal of relatively high electrical conductivity overlying and bonded to one side of the sheet of metal of relatively high electrical resistivity, and a layer of an electrially insulating organic material having a first side adherent to and supporting an opposite side of the sheet of metal of relatively high electrical resistivity for permitting portions of said sheets of metal of relatively high electrical conductivity and resistivity to be selectively removed from the organic layer to from an electrical circuit and for permitting portions of said metal of relatively high electrical conductivity to be selectively removed from a portion of said metal of relatively high electrical resistivity in the circuit to provide a resistor element with length and width to display selected electrical resistance in the circuit, the substrate having a heat-sink layer of metal of relatively high thermal conductivity adherent to and supported on a side of the layer of electrically insulating organic material opposite said first side thereof for withdrawing heat from said resistance element, the organic material having a multiplicity of particles of material of relatively higher thermal conductivity than said organic material dispersed in the organic material for enhancing heat-withdrawal and dissipation of heat from the resistance element through the electrically insulating organic layer to permit the length and width of the resistance element to be selected to be more compactly accommodated in the substrate to provide said selected resistance in the circuit while retaining operating temperature of the resistance element in the circuit below a selected temperature.

2. A substrate according to claim 1 wherein the sheet of ultrathin metal of relatively high electrical resistivity comprises a nickel-chromium alloy having a thickness in the range from about 4 to 16 microinches, the sheet of metal relatively high electrical conductivity is formed of a material selected from the group consisting of copper and its alloys, aluminum and its alloys, and composite metal laminates embodying said materials, the organic material is selected from the group consisting of epoxies, acetal resins, polyimides, polyamides, polyimidepolyamides, polyesters, polyolefins, tetrafluoroethylene, and acrylonitrile butadiene styrene copolymers, the particles are selected from the group consisting of oxides, nitrides, and carbides of aluminum, boron, beryllium, magnesium, zinc, silicon and titanium, and the materials of the heat-sink layer are selected from the group consisting of copper and its alloys, aluminums and its alloys, iron and its alloys and composite metal laminates embodying said materials.

3. A resistor element for an electrical circuit comprising a layer of ultrathin metal of relatively high electrical resistivity having a selected sheet resistivity characteristic and having a selected length and width providing a selected resistance through the layer along its length, a layer of electrically insulating organic material having a first side thereof adherent to and supporting the layer of metal of relatively high electrical resistivity, leads at opposite ends of said selected length at said first side of the layer of organic material electrically connected to the layer of metal of relatively high electrical resistivity for electrically connecting said selected electrical resistance in a circuit, a heat-sink layer of metal of relatively high thermal conductivity adherent to and supported on a side of the organic layer material opposite said first side thereof for withdrawing heat from the layer of metal of relatively high electrical resistivity, and a multiplicity of particles of material of relatively higher thermal conductivity than the organic material dispersed in the organic material to enhance heat-withdrawal from the layer of metal of relatively high electrical resistance so that the length and width of the layer of the ultrathin metal of the selected sheet resistivity displaying the selected electrical resistance is more compactly accommodated in the element while retaining operating temperature of the resistor element in the circuit below a selected temperature.

4. An electrical circuit having a resistor element therein comprising circuit path means, a layer of ultrathin metal of relatively high electrical resistivity having a selected length and width providing a selected electrical resistance through the layer along the length thereof, an electrical insulating layer of organic material adherent to the layer of a ultrathin metal of high electrical resistivity supporting the circuit path means and the high electrical resistivity layer in the circuit on one side of the electrically insulating layer, pads of metal of relatively high electrical conductivity overlying and bonded to the high electrical resistivity layer at opposite sides of said selected length in electrically connected relation to the high electrical resistivity layer connecting the selected electrical resistance in the circuit, a heat-sink layer of metal of relatively high thermal conductivity adherent to and supported on an opposite side of the electrically insulating layer for rapidly withdrawing heat from the high electrical resistivity layer in the circuit, and a multiplicity of particles of material of relatively higher thermal conductivity than said organic material dispersed in said organic material for enhancing heat-transfer from the high electrical resistivity layer in the circuit to the heat-sink layer to permit the length and width of the high electrical resistivity layer to be selected to be more compactly accommodated in the substrate to provide the selected resistance while retaining operating temperatures of the high electrical resistivity layer below a selected temperature.

* * * * *